United States Patent
Plankensteiner et al.

(10) Patent No.: US 10,136,472 B2
(45) Date of Patent: Nov. 20, 2018

(54) TERMINAL FOR MECHANICAL SUPPORT OF A HEATING ELEMENT

(75) Inventors: Arno Plankensteiner, Absam (AT); Christian Feist, Innsbruck (AT); Vadim Boguslavskiy, Princeton, NJ (US); Alexander I. Gurary, Bridgewater, NJ (US); Chenghung Paul Chang, Easton, PA (US)

(73) Assignees: Plansee SE, Reutte (AT); Veeco Instruments Inc., Plainview, NY (US)

( * ) Notice: Subject to any disclaimer, the term of this patent is extended or adjusted under 35 U.S.C. 154(b) by 1297 days.

(21) Appl. No.: 13/568,928

(22) Filed: Aug. 7, 2012

(65) Prior Publication Data
US 2014/0042147 A1 Feb. 13, 2014

(51) Int. Cl.
H05B 1/00 (2006.01)
C23C 16/458 (2006.01)
C23C 16/46 (2006.01)
H01L 21/67 (2006.01)

(52) U.S. Cl.
CPC ........... H05B 1/00 (2013.01); C23C 16/4585 (2013.01); C23C 16/46 (2013.01); H01L 21/67115 (2013.01)

(58) Field of Classification Search
CPC ...... H05B 3/06; H05B 3/08; H05B 2203/017; H01L 21/67103; H01L 21/67109
USPC ...................... 219/390, 528, 520, 540, 444.1
See application file for complete search history.

(56) References Cited

U.S. PATENT DOCUMENTS

| | | | |
|---|---|---|---|
| 1,759,722 A * | 5/1930 | Watson | F16F 1/20 267/47 |
| 3,519,798 A | 7/1970 | Walther | |
| 4,833,039 A * | 5/1989 | Mitoff | C04B 41/52 427/125 |
| 5,099,099 A * | 3/1992 | Saito | 219/89 |
| 5,209,518 A * | 5/1993 | Heckenliable et al. | 280/680 |
| 5,447,570 A | 9/1995 | Schmitz et al. | |
| 5,643,649 A * | 7/1997 | Hagan et al. | 428/64.1 |
| 5,902,406 A | 5/1999 | Uchiyama et al. | |
| 6,118,100 A | 9/2000 | Mailho et al. | |
| 6,856,078 B2 | 2/2005 | Halpin | |
| 6,902,572 B2 * | 6/2005 | Beulke | A61F 2/013 606/159 |
| 2002/0158060 A1 * | 10/2002 | Uchiyama | H01L 21/67103 219/444.1 |
| 2002/0180466 A1 | 12/2002 | Hiramatsu et al. | |
| 2005/0106319 A1 | 5/2005 | Jurgensen et al. | |
| 2006/0130763 A1 | 6/2006 | Emerson et al. | |

(Continued)

FOREIGN PATENT DOCUMENTS

CN 102005212 A 4/2011
JP S605089 U 1/1985

(Continued)

Primary Examiner — Jimmy Chou
(74) Attorney, Agent, or Firm — Laurence A. Greenberg; Werner H. Stemer; Ralph E. Locher (57) ABSTRACT

A terminal for mechanical support of a heating element, includes a base device, a mounting device, the mounting device adapted to support the heating element, and a support device connecting the base device to the mounting device, the support device allowing displacement of the heating element about a radial axis and less than about 10% displacement of the heating element about a tangential and/or axial axis.

10 Claims, 5 Drawing Sheets

(56) References Cited

U.S. PATENT DOCUMENTS

| | | |
|---|---|---|
| 2006/0207120 A1 | 9/2006 | Komatsu |
| 2009/0114624 A1* | 5/2009 | Ogoshi ................. B23K 37/02 219/86.25 |
| 2011/0052349 A1 | 3/2011 | Sone et al. |
| 2011/0179717 A1 | 7/2011 | Taniyama |

FOREIGN PATENT DOCUMENTS

| | | |
|---|---|---|
| JP | H10189227 A | 7/1998 |
| JP | H111774 A | 1/1999 |
| JP | 2002203664 A | 7/2002 |
| JP | 2003142037 | 5/2003 |
| JP | 2004119520 A | 4/2004 |
| JP | 2011253692 A | 12/2011 |
| TW | 506620 U | 10/2002 |
| TW | 201140740 A | 11/2011 |
| WO | 2004030063 A1 | 4/2004 |
| WO | 2008087983 A1 | 7/2008 |

* cited by examiner

FIG. 5

TERMINAL FOR MECHANICAL SUPPORT OF A HEATING ELEMENT

BACKGROUND OF THE INVENTION

Field of the Invention

The present invention is related to a terminal for a mechanical support of a heating element as well as to a heater comprising at least one heating element.

Heating elements for heaters of MOCVD (metal organic vapor deposition) Reactors are commonly known. They are used to heat wafer carriers (susceptors) inside of a MOCVD Reactor for the epitaxial growth of compound semiconductors. To make sure that the heating elements of a heater of the MOCVD Reactor are positioned correctly, different kinds of mechanical support structures are known. Usually terminals are used, which support the heating element of a heater of a MOCVD Reactor, to keep it in a predefined position.

One problem of known terminals for a mechanical support for a heating element is that the thermally induced deformation of the heating element, as well as of the terminal itself, causes problems. One of those problems is the creation of mechanical stress inside of the material of the heating element of the heater. During the MOCVD process inside of the reactor, the heater is heated up to 1000 to 2200° C. This leads to very high temperature differences between the situation where the MOCVD Reactor is loaded (room temperature) with substrates for the MOCVD growth process and the situation during the growth itself. One result of this high temperature difference is a thermally induced expansion of the heating element. Usually, the heating element is kept in place by the terminal and therefore the terminal tries it to keep the heating element in the position predefined at room temperature. During a heating up process up to 2200° C., the heating element tries to extent its dimensions and therefore thermally induced stress is generated inside the material of the heating element.

To overcome issues with fixed terminals, various flexible elements have been used, which are designed to allow expansion in preferable directions and restrict deformations in undesirable directions. These elements produce mechanical loads within heater elements, which increase with displacement of the heater elements, which in turn increases with temperature. The strength and creep resistance of refractory metals decreases with temperature, and falls sharply above 1200 to 1400° C. Under these conditions, the flexible elements, designed to control undesired deformations, become themselves another source of such undesirable deformations, because they produce stresses comparable with reduced strength of the heating elements.

It is already known to construct terminals to compensate such thermally induced stress inside the heating element partially. Said known terminals comprise different kinds of U-form springs, which are able to allow a movement of the connection position between the heating element and the terminal. Thereby, thermally induced stress inside of the heating element is reduced. However, known terminals of this kind have the disadvantage that the heating element can extended itself in two or more directions. This leads to the risk of a contact with other parts of the heating system or itself and a short circuit can occur. Moreover, due to the U-form of the springs, mechanical stress results within the material of the heating element in two directions. Therefore, the material of the heating element has to be more stress resistant and therefore more expansive. In terms of mechanical engineering, known terminals are able to give freedom of movement to the heating element in two or more directions of deformation. This results in at least one bending moment inside the material of the heating element and in the risk of short circuits.

SUMMARY OF THE INVENTION

It is one object of the present invention to solve at least some of aforesaid problems of state of the art terminals. In particular, it is an object of the present invention to provide a terminal for a mechanical support for a heating element in particular of a heater of a MOCVD Reactor as well as a heater in particular for a MOCVD Reactor comprising at least one heating element and at least two terminals, wherein thermally induced stress inside the heating element is reduced during usage.

Aforesaid problem is solved by a terminal for mechanical support for a heating element in particular of a heater of a MOCVD Reactor as well as by a heater in particular for a MOCVD Reactor comprising at least one heating element and at least two terminals with the features set forth in the present application. Further features and details of the present invention discussed with respect to the subclaims can be combined freely with each other as well as with the inventive terminal and the inventive heater.

According to the present invention, the terminal for mechanical support for a heating element of a heater in particular of a MOCVD Reactor comprises a mounting device being adapted to support the heating element. Furthermore, a base device for securing the terminal on a base and a support device is provided, the support device allowing displacement of the heating element about a radial axis and less than about 10% displacement of the heating element about a tangential and/or axial axis. The radial, tangential and axial directions/axes are defined by the planar extension of the heating element when mounted at the mounting device in the oriented position.

In particular, the support device is located within the force track between the mounting device and the base device. Moreover, the support device has one single main spring direction which is oriented substantially along the radial direction, wherein the radial direction is defined by the planar extension of the heating element when mounted at the mounting device in the oriented position. The heating element can be linear or curved. The radial, the axial and the tangantial directions can be defined by the overall geometrical structure of the heating element beside the fact that the arriving part of the heating element at the mounting device can be of substantially straight configuration. In particular, an inventive terminal comprises the mounting device for mounting a curved arriving heating element and thereby the radial, the axial and the tangantial directions are defined by the curvature of the heating element when mounted at the mounting device in the oriented position. Additionally, an inventive terminal can also comprise a mounting device for mounting a linear heating element where the radial direction is defined by the planar extension of the heating element when mounted at the mounting device in the oriented position.

A substantially planar, in particular curved arriving heating element can comprise in particular an extension which can be surrounded by a circle. Thereby different kinds of curves or linear components of the heating element can be positioned in such circular surrounding. In particular, the heating element itself arrives at the mounting device of the terminal in a way that during the heating up process of the heating element a thermally induced deformation of the heating element wants to take place. That thermally induced deformation results in a movement of the heating element and the mounting device relatively to the base device of the terminal. Against that movement during the heating up process of the heating element, the support device comprises in particular one single main spring direction.

A "single main spring direction" in the meaning of the present invention can also be called a single main elastic direction. This is the direction in which the material and/or the geometry of the support device have their main resiliency. That can be understood in particular with respect to a coordination system with three different directions of deformation of the terminal, in particular of the support device. In such a coordination system one of the three coordinates defines one main spring direction, which is also substantially the main thermally induced deformation direction of the heating element. According to that understanding, an inventive terminal gives the possibility to reduce the movement of the heating element at the mounting device relative to the base device substantially to only one single direction, in particular the radial direction or the radial axis, respectively. It leads further to the possibility that thermally induced stress inside the material of the heating element is reduced. In particular bending moments can be reduced. Due to this fact, cheaper and less material can be used for the heating element and the life time for the heating element is increased.

A terminal according to the present invention is meant for mechanical support for a heating element in particular of a heater of a MOCVD Reactor. Therefore, the terminal can also be called a MOCVD Reactor heater terminal according to the present invention.

An inventive terminal can be used for mechanical support only or for a combined support of a mechanical and electrical support of the heating element. In particular, one and the same terminal can be used for both kinds of support. The terminal is in particular constructed such that the main spring direction gives the possibility of a movement of the heating element of up to 2% of the diameter of the heating element, if it is a curved heating element. In particular, the support device allows a movement of the heating element of 1% of the diameter of the curved heating element: This is enough suspension to allow the thermally induced deformation of the heating element between the room temperature and the operational temperature of the heating element between 1000 and 2200° Celsius in the radial direction.

The terminal, in particular the support device, is flexible with respect to one direction, namely the main spring direction. Moreover, it is stable as to the other two directions of the three directions of deformations. In a coordination system, for example giving three directions, namely the radial direction/axis, the axial direction/axis and one direction in tangential direction/axis, only in radial direction the flexibility is given. Therefore, in such an embodiment the radial direction is the single main spring direction of the support device and the single thermally induced deformation direction of the heating element.

A planar arriving heating element is in particular a curved arriving heating element. This can be understood as a heating element which is at least at the point of arriving at the mounting device of a curvature structure. This leads to a situation where the heating element is thermally induced deformed such that a radial movement of the heating element takes place. This radial movement of the heating element is allowed by the terminal due to the one single main spring direction in a radial direction. The base device can in particular be a rigid base of a reactor housing or a base plate itself. The base device is in particular configured to allow the mounting of the terminal to further parts of the MOCVD reactor.

The term "force track" can be understood as the track between the base device and the mounting device, which is guiding the force from the mounting of the heating element into the base. The term "substantially along the radial direction" means a deviation of ±10° along the radial direction.

It can be of advantage if a terminal according to the present invention is characterized in that relation between at least one other spring direction and the single main spring direction of the support device is less than 10% for substantially decoupling one deformation direction from the other deformation directions. This leads to the advantage that the relation between tangential spring direction to the radial spring direction and the axial spring direction to the radial spring direction is less than 10%. This can be understood as a maximum threshold for the further spring directions of the support device. According to the specific embodiments it can be of advantage if the maximum threshold is a lot lower. In particular, if relatively long support devices are used, even smaller maximum thresholds, for example 5% or 1% according to the above mentioned definition can be of advantage.

It is also possible that according to the present invention the terminal is characterized in that the support device comprises a spring. In particular, the support device is a leaf spring, whereas the leaf spring can comprise two or more leafs which are arranged substantially parallel in orientation. The use of at least two leaf springs leads to a cheap and simple construction of the whole terminal. Moreover, the leaf springs are able to supply higher values of a power due to the fact that they have a relatively big cross-section. The dimensions of the leaf springs are in a wide direction in particular between 10 to 40 mm, in height in particular between a 100 to 150 mm and in thickness in particular between 0.1 to 1 mm. It can be of advantage if all leaf springs are in particular identical as to the material and/or as to their dimensional extension. The leaf springs are of advantage if they are aligned at least substantially parallel. The use of at least parallel arranged leaf springs leads to the advantage that a parallelogram is buildup for mechanical stiffness matrix of the whole terminal. Within that stiffness matrix, only the radial direction is the flexibility direction, namely the single main spring direction. It is decoupled from the other spring directions, namely from other deforming directions as they are the tangential and the axial deformation direction. The leaf springs are in particular substantially of plate-like geometry.

It is also possible that a terminal according to the present invention is characterized such that is configured for the supply of the heating element with electrical power. This could lead to different kinds of geometrical expression. In particular, the different elements of the terminal, namely in particular the mounting device, the support device and/or the base device are constructed with cross-sections to allow electrical power to be transported to the mounting device and therefore to be supplied to the heating element. At least two of such terminals can be located within a MOCVD Reactor and therefore the positive and the negative electrical connection can be handled by one or two of said inventive terminals. It can also be of advantage if one terminal fits both needs, namely the mechanical and the electrical support.

It could further be of advantage, if an inventive terminal is characterized in that the connection between the support device and the mounting device as well as with the base device comprises a substantially flat connection area. This leads to a better supply of electrical power, in particular as to the increased cross-section. Moreover, the mechanical fixation, for example screws together with a metal sheet, can be carried out in an easier way. Moreover, the substantially flat connection area leads to a better guidance of the force along the force track and therefore along and through the support device.

It can also be of advantage if an inventive terminal is characterized in that the material of the terminal comprises at least 90% by weight of a refractory metal. In particular, the refractory metal is selected from tungsten, molybdenum, niobium, tantalum, rhenium, and alloys thereof. Moreover, it is possible that the refractory metal is selected from tungsten, an alloy of tungsten, molybdenum and an alloy of molybdenum. In particular identical material is used for all components of the terminal, in particular also for the support devices. One example for the material is tungsten or an alloy of tungsten (at least 90% by weight of tungsten), known as vacuum metalized tungsten alloy. A further example for the material is molybdenum or an alloy of molybdenum (at least 95% by weight molybdenum).

A further advantage can be achieved, if an inventive terminal is characterized in that the mounting device comprises an elongated part displacing the place of mounting the heating element from the connection between the mounting device and the support device. This allows a distance between the mounting place and the connection to the support device. It gives space for an insulation between the heating elements and a base plate.

It can also be possible that according to the present invention the terminal is characterized in that the elongated part has a reduced cross-section with respect to the cross-section of the support device. These cross-sections are the overall cross-sections of both parts. That has to be understood as the outer line of the elongated part which is located inside the outer line of the mounting device, the support device and/or the base device. Thereby it is possible to reduce holes in the insulation material for the extension of the elongated parts.

Those skilled in the art will appreciate that there are numerous methods in which to connect the heating element to the mounting device. Such methods include clamping, welding, screwing, bolting, and the like. Since electrical power to the heating element often times flow through the mounting device, the method selected to connect the heating element to the mounting device should ensure sufficient surface contact between the mounting device and heating element to ensure proper electrical connection between the mounting device and heating element.

One further object of the present invention is to provide a heater in particular for a MOCVD Reactor comprising at least one heating element and at least two terminals according to the present invention. Thereby, such an inventive heater is able to reach the same advantages that have already been discussed in detail with respect to an inventive terminal.

An inventive heater can be characterized such that each heating element comprises two terminals which are configured for power supply to the heating element and which are located at both ends of the heating element. This is one possibility to use almost the full material extension of the heating element for the heating process. It is heated up by the power supply through the two terminals. Of course, also further terminals are possible, in particular only for mechanical support of the heating element which are located with respect to the two ends of the heating element between the two end terminals for power supply. The power supply terminals are in particular also configured for mechanical support of the heating element.

The heater according to the present invention can be characterized in that the support device of at least one terminal is pre-tensioned in its stable (unheated, that is at room temperature) position. This achieves the advantage that the pre-tension is in particular in the same direction of the movement of the support device during usage of the heating element. If the present invention is used for heater with a substantially circular extension, this leads to a pre-tension in the outward, namely in the radial direction. The heating element keeps the terminal in place and thereby keeps the force of the pre-tension in the predefined situation. The direction of the pre-tension is therefore in particular in the direction of the expectable thermally induced deformation, namely the main thermally induced deformation direction. This direction is in particular also consistent with the main spring direction of the support device, namely the radial direction.

It is possible that a heater according to the present invention is characterized in that the pre-tension of the support device is configured to achieve a reduced spring tension of the heating element at operational temperature. The stress is reduced in particular to a value which is lower than the yield strength of the heating element at the explicit temperature at about 2000°. The temperature for the use of an inventive heater is in particular in a temperature range between 1000 and 2200° Celsius.

Other features which are considered as characteristic for the invention are set forth in the appended claims.

Although the invention is illustrated and described herein as embodied in a terminal for mechanical support of a heating element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE INVENTION

In the FIGS. 1 to 3b one embodiment of the inventive terminal 10 is shown. According to this embodiment, the terminal 10 comprises a mounting device 20 as well as a base device 30. The base device 30 is for example fixed on a support plate (not shown) with screws or any other kind of mechanical fixation means.

Figure 1:
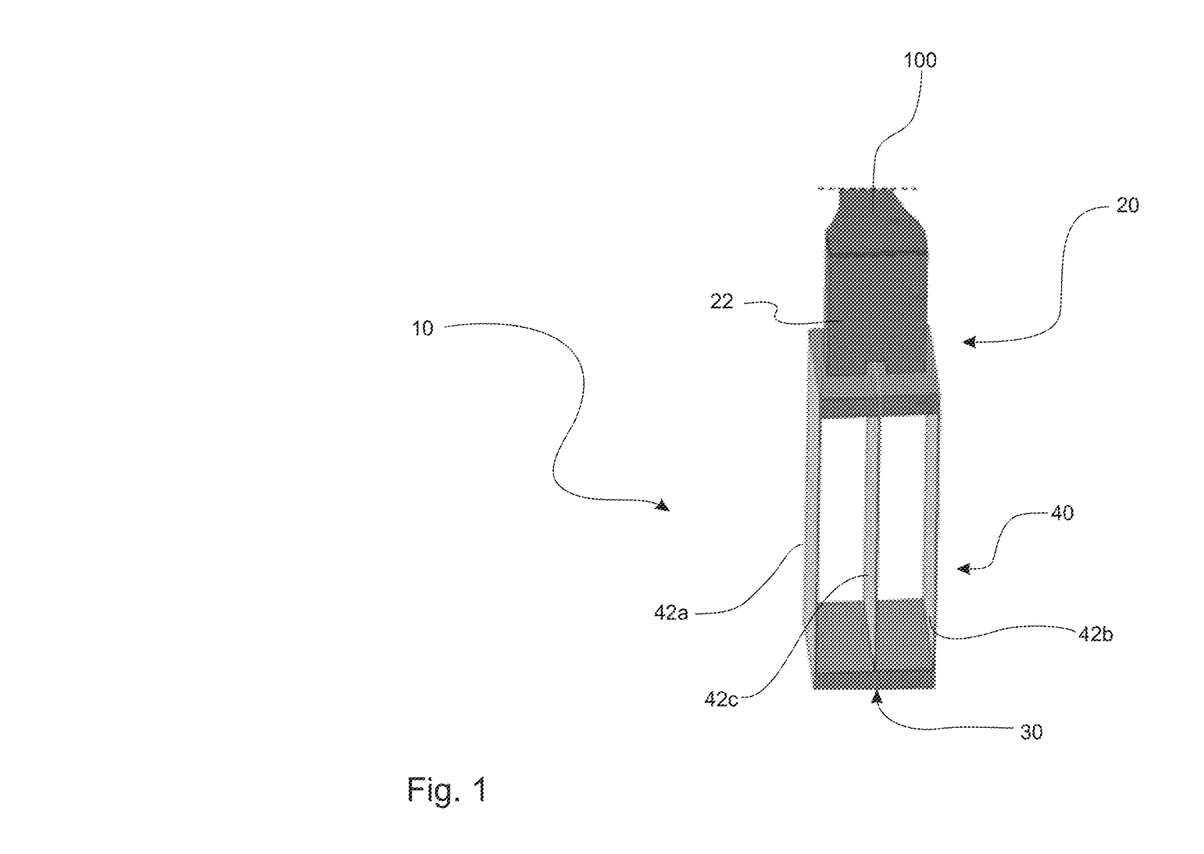
FIG. 1 a view of a terminal according to the present invention.
Figure 2:
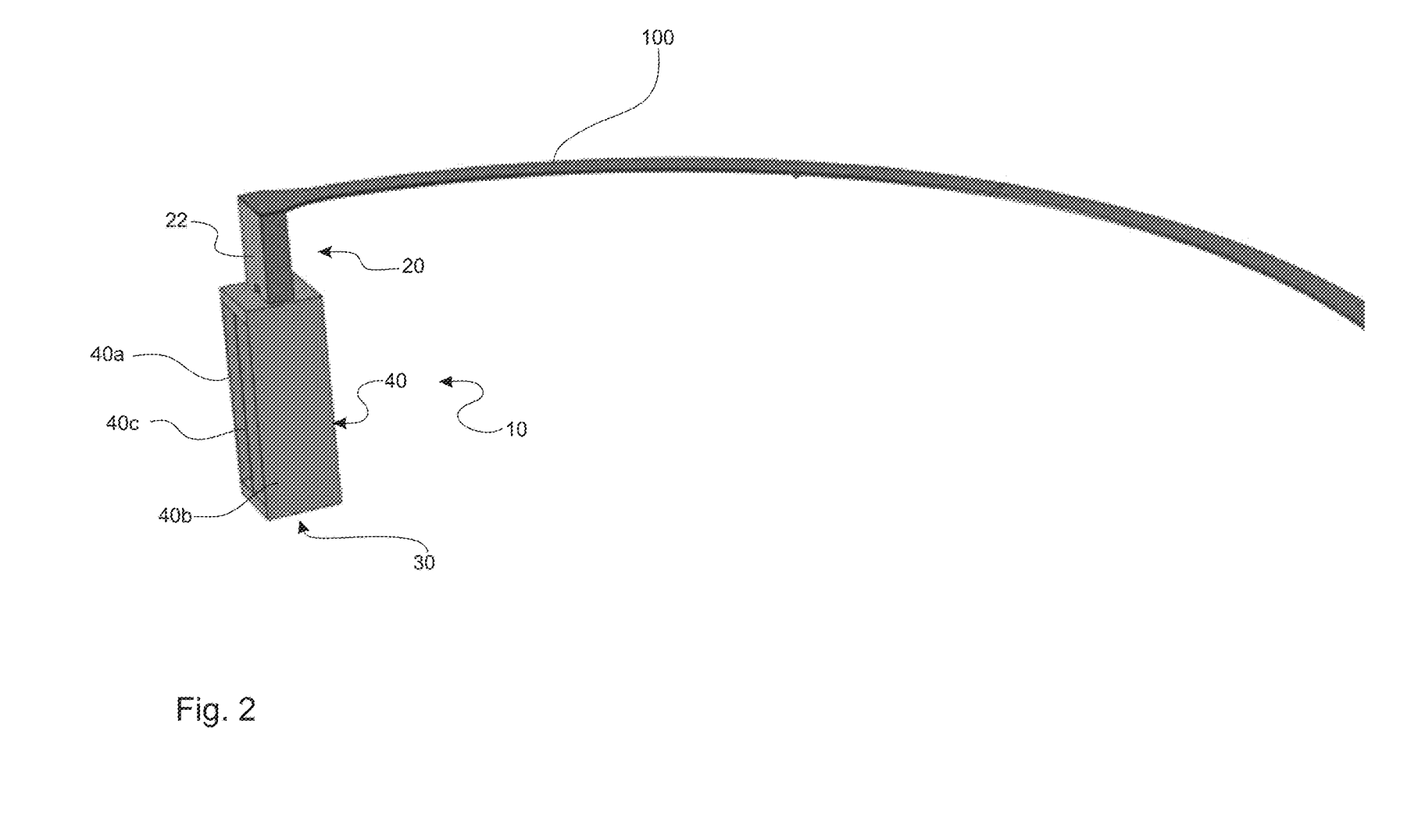
FIG. 2 the terminal according to FIG. 1 with a mounted heating element.

In FIG. 2 it can be seen that a heating element 100 is mounted at the mounting device 20. To do so, the mounting device 20 comprises an elongated part 22. On the top of that elongated part 22, the curved heating element 100 is mounted to the mounting device. One example of a useful heating element 100 is found in the U.S. patent application Ser. No. 13/568,915 entitled "HEATING ELEMENT FOR A PLANAR HEATER OF A MOCVD REACTOR", filed on even date hereof, the contents of which are hereby incorporated herein by reference.

Between the mounting device 20 and the base device 30, a support device 40 is located. The location of that support device 40 is arranged that such that it is located inside the force track between the base device 30 and the mounting device 20. In other words, any force that is applied by or on the heating element 100 is guided from the mounting device 20 along the force track and therefore through the support device 40 to the base plate 30 and for example therefore further to a support plate.

The support device 40 according to the present embodiment can be a spring. The spring can comprise at least two leaf springs. One embodiment of the present invention has three leaf springs 42a, 42b and 42c. Leaf springs 42a, 42b and 42c are arranged in a substantially parallel orientation. This leads to a possibility of a deflection of the spring element according to a parallelogram in the geometrical sense.

Figure 3A:
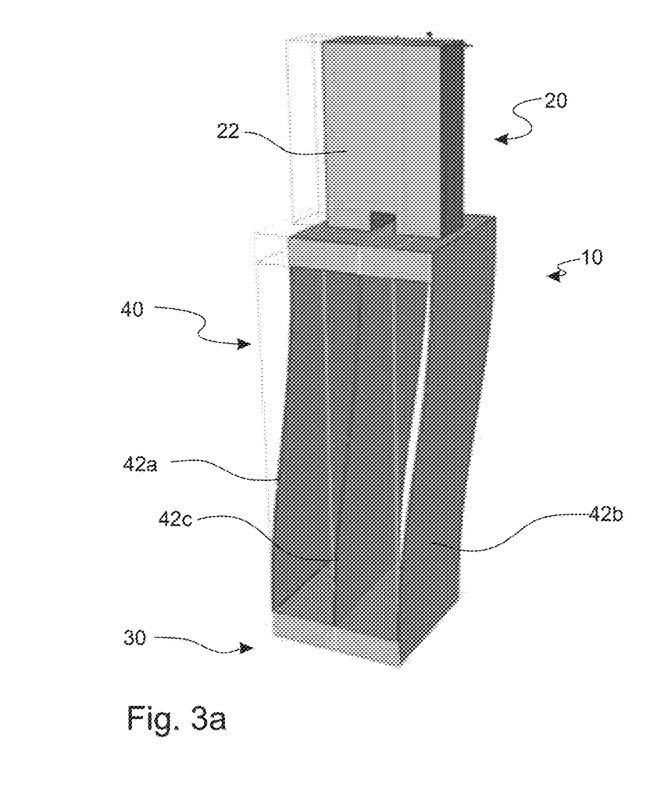
FIG. 3a the embodiment of FIG. 1 during the hot situation.
Figure 3B:
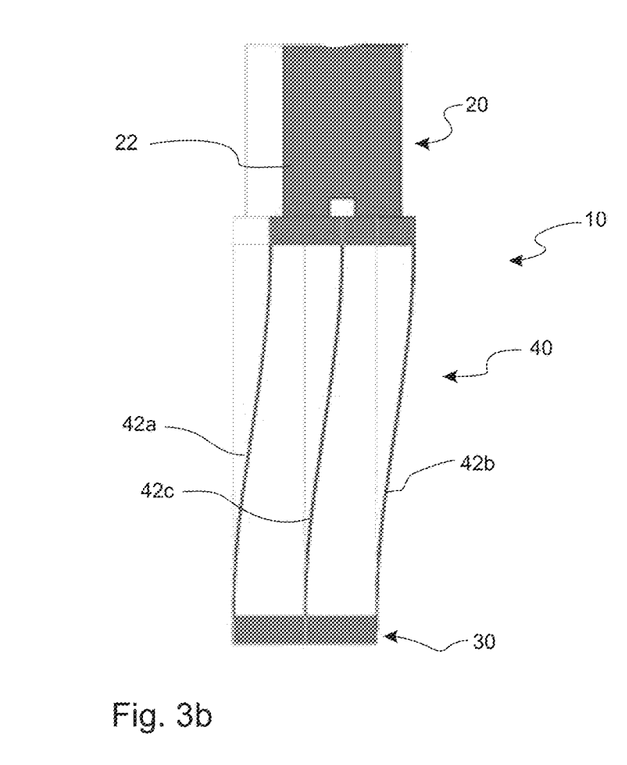
FIG. 3b the situation of FIG. 3a in a further view.
Figure 4:
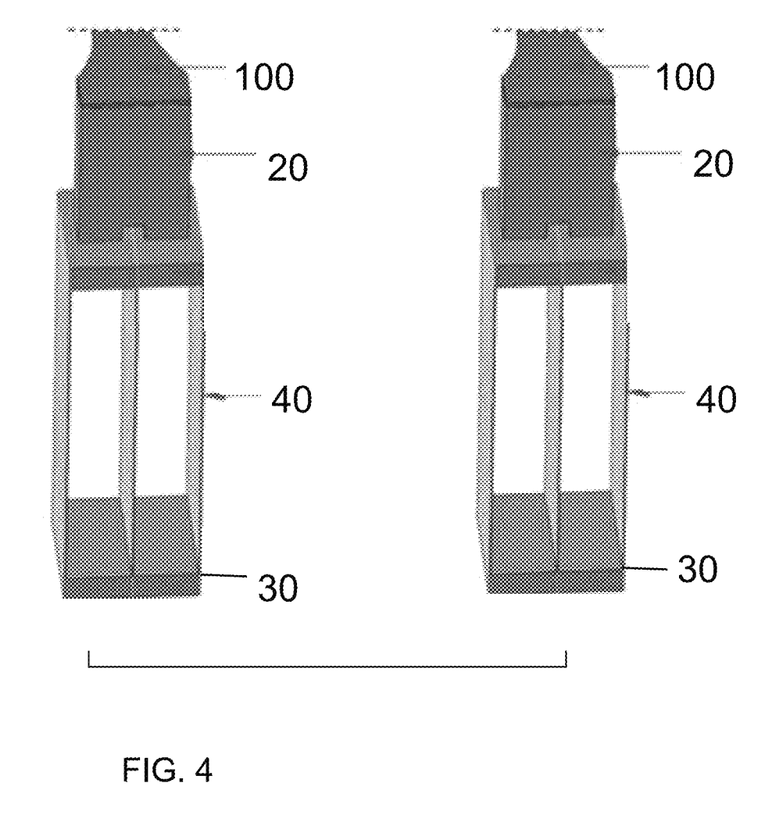
FIG. 4 is a view of two terminals provided for supporting one heating element.
Figure 5:
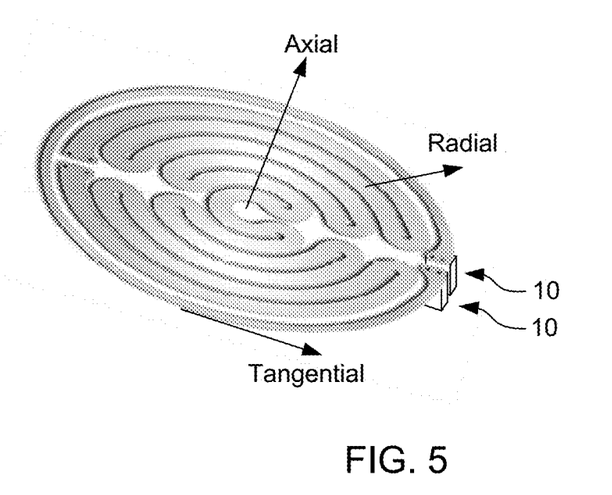
FIG. 5 is a view of an MOCVD heating element indicating the axial, tangential and radial directions and showing two terminals for mounting the heating element.

FIGS. 3a and 3b show one situation during the deflection of the support device 40. This happens to be during the heating of the heating element 100. As the inventive terminal 10 is used for a MOCVD Reactor, the heating element 100 is heated up to 1000 to 2200° Celsius. As it can be seen in FIG. 2, the heating element 100 is of a relatively large dimension. After and during heating up of that process temperature, the heating element 100 is affected by the thermally induced deformation. In particular, the dimension of the heating element 100 is getting longer and therefore tends to move radially outward. To reduce thermally induced stress inside of the heating element 100, the terminal 10 according to the present invention allows a movement of the heating element 100 relative to the base device 30. This movement is carried out against the support device 40 as it can be seen schematically in the FIGS. 3a and 3b.

The mounting device 20 is dislocated as to the base device 30 by a parallel movement of the mounting device 20 relative to the base device 30. To do so, the different leaf springs 42a, 42b and 42c are displaced and bended. Due to the fact that the leaf springs 42a, 42b and 42c are substantially located parallel, they comprise one single main spring direction. As it can be seen in FIG. 2, that single main spring direction is directed in the radial direction as to the heating element when it is mounted at the mounting device and oriented position. Therefore, the radial deformation direction is decoupled from further deformation directions of the heating element 100 as well as of the terminal 10. The decoupling is in particular carried out such that a deformation in a radial direction results in less than 10% of a deformation in any other deformation direction, in particular in the tangential out or the axial direction of the heating element 100.

REFERENCE SIGNS

10 Terminal
20 mounting device
22 elongated part
30 base device
40 support device
42a leaf spring
42b leaf spring
42c leaf spring
100 Heating element

The invention claimed is:

1. A terminal for mechanical support of a heating element in a MOCVD reactor, comprising a base device, a mounting device, the mounting device being configured to mechanically support the heating element in the MOCVD reactor, and a support device connecting the base device to the mounting device, said support device being a leaf spring having two or more leaves disposed at a spacing distance from one another and arranged in a substantially parallel orientation, said support device allowing displacement of the heating element about a single main elastic direction being oriented substantially along a radial direction defined by a planar extension of the heating element when mounted at the mounting device, and wherein a material of the terminal comprises at least 90% by weight of a refractory metal selected from a group consisting of tungsten, an alloy of tungsten, molybdenum, and an alloy of molybdenum.

2. A heater, comprising at least one heating element and at least two terminals according to claim 1.

3. The heater according to claim 2, wherein the support device of at least one terminal is pre-tensioned in a stable position.

4. The heater according to claim 3, wherein the pre-tension of the support device is configured to achieve a reduced spring tension of the support device during a heating use of the heating element.

5. A terminal for mechanical support of a heating element in a MOCVD reactor, comprising a base device, a mounting device, the mounting device being configured to mechanically support the heating element in the MOCVD reactor, and a support device connecting the base device to the mounting device, said support device being a leaf spring having two or more leaves disposed at a spacing distance from one another and arranged in a substantially parallel orientation, said support device allowing displacement of the heating element about a radial axis and less than about 10% displacement of the heating element about a tangential and/or axial axis, and wherein a material of the terminal comprises at least 90% by weight of a refractory metal selected from a group consisting of tungsten, an alloy of tungsten, molybdenum, and an alloy of molybdenum.

6. A heater comprising at least one heating element and at least two terminals according to claim 5.

7. The heater according to claim 6, wherein the support device of at least one terminal is pre-tensioned in a stable position.

8. The heater according to claim 7, wherein the pre-tension of the support device is configured to achieve a reduced spring tension of the support device during the heating use of a heating element.

9. A terminal for mechanical support of a heating element in a MOCVD reactor, the terminal comprising:
    a base device;
    a mounting device to be connected to an arriving part of the heating element of the MOCVD reactor and configured to support the heating element in the MOCVD reactor; and
    a support device connecting said base device to said mounting device, said base device, said support device and said mounting device forming an assembly configured to withstand prevailing operating temperatures in the MOCVD reactor;

said support device being a leaf spring with a plurality of mutually parallel leaves extending longitudinally between said base device and said mounting device and at a spacing distance from one another, said leaf spring being formed to allow a displacement of said mounting device only about a single main elastic direction due to a thermally induced deformation of the heating element.

10. A terminal for mechanical support of a substantially planar and round heating element in a MOCVD reactor, the terminal comprising:

a base device;

a mounting device to be connected to an arriving part of the heating element of the MOCVD reactor and configured to support the heating element in the MOCVD reactor; and a leaf spring with two or more leaves disposed at a spacing distance from one another and arranged in a substantially parallel orientation and extending between said base device and said mounting device;

said leaf spring being configured to allow a displacement of said mounting device, upon being subjected to a displacement of the arriving part of the heating element due to a thermally induced deformation of the heating element, about a radial axis of the heating element and less than about 10% displacement of the mounting device about a tangential direction or parallel to an axis of the round heating element.

* * * * *